(12) United States Patent
Kitaoka et al.

(10) Patent No.: US 7,913,646 B2
(45) Date of Patent: Mar. 29, 2011

(54) VACUUM PROCESSING APPARATUS AND VACUUM PROCESSING METHOD

(75) Inventors: Ken Kitaoka, Kudamatsu (JP); Masamichi Sakaguchi, Kudamatsu (JP); Kazue Takahasi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 241 days.

(21) Appl. No.: 12/199,820

(22) Filed: Aug. 28, 2008

(65) Prior Publication Data

US 2009/0288684 A1 Nov. 26, 2009

(30) Foreign Application Priority Data

May 22, 2008 (JP) .................................. 2008-134500

(51) Int. Cl.
B05C 11/06 (2006.01)
B05C 13/00 (2006.01)
(52) U.S. Cl. ........ 118/723 R; 118/723 MN; 256/345.29
(58) Field of Classification Search ............. 118/723 R, 118/723 MP, 50, 70, 72; 156/345.29, 345.38; 204/298.01, 298.07, 298.33; 134/1.1, 21, 134/902
See application file for complete search history.

(56) References Cited

U.S. PATENT DOCUMENTS

| 2005/0241770 A1 | 11/2005 | Moriya et al. |
| 2009/0223450 A1* | 9/2009 | Moriya et al. ............ 118/723 R |
| 2009/0246406 A1* | 10/2009 | Nakayama et al. ............ 427/569 |

FOREIGN PATENT DOCUMENTS

| JP | 10-321488 | 4/1998 |
| JP | 2005-317782 | 10/2005 |
| JP | 2005317782 | * 11/2005 |

* cited by examiner

*Primary Examiner* — Michael Barr
*Assistant Examiner* — Saeed T Chaudhry
(74) *Attorney, Agent, or Firm* — Antonelli, Terry, Stout & Kraus, LLP.

(57) ABSTRACT

The invention provides a vacuum processing apparatus having a function for removing particles on the surface of the sample stage in order to improve the yield of the sample being processed. The vacuum processing apparatus comprises a processing chamber 104 disposed in a vacuum reactor and having plasma formed in the interior thereof, a sample stage 113 placed below the processing chamber 104 and having a sample 102 to be processed placed on the upper plane thereof for processing, and a gas introducing mechanism placed at an upper portion of the processing chamber 104 and having introduction holes for introducing processing gas into the processing chamber, wherein the sample stage 113 comprises grooves 117 and a gas supply port 119 for introducing thermal conductance gas 118 between the sample stage and the sample 102 to be processed, and a mechanism for introducing dust removal gas 120 through the gas supply port 119 between the sample stage 113 and the sample 102 to be processed or a dummy sample 202 having substantially the same shape as the sample to be processed placed on the sample stage 113 within the vacuum reactor, by which particles 201 attached to the sample stage 113 are removed via hydrodynamic force by the dust removal gas 120.

4 Claims, 6 Drawing Sheets

FIG. 4

PRIOR ART OPERATION

| | |
|---|---|
| A-1) | SET VACUUM PROCESSING CHAMBER TO ATMOSPHERIC PRESSURE |
| A-2) | RELEASE PROCESSING CHAMBER TO ATMOSPHERE (REMOVE PARTS) |
| A-3) | CLEAN SAMPLE STAGE SURFACE + CLEAN INNER SIDE OF PROCESSING CHAMBER |
| A-4) | ASSEMBLE PROCESSING CHAMBER PARTS |
| A-5) | VACUUM INTERIOR OF PROCESSING CHAMBER |
| A-6) | PERFORM PRE-CONDITIONING DISCHARGE WITHIN PROCESSING CHAMBER |

PRESENT EMBODIMENT
(VACUUM STATUS RETAINED)

| | |
|---|---|
| B-1) | TRANSFER DUMMY SAMPLE |
| B-2) | DUST REMOVAL OPERATION (APPLY HIGH VOLTAGE, INTRODUCE INERT GAS) |
| B-3) | TAKE OUT DUMMY SAMPLE |

VACUUM PROCESSING APPARATUS AND VACUUM PROCESSING METHOD

The present application is based on and claims priority of Japanese patent application No. 2008-134500 filed on May 22, 2008, the entire contents of which are hereby incorporated by reference.

BACKGROUND OF THE INVENTION

1. Field of the Invention

The present invention relates to a vacuum processing apparatus having a function to remove particles from the surface of a sample stage arranged in a processing chamber disposed in a vacuum processing apparatus in which plasma is generated, and a vacuum processing method using the above-described vacuum processing apparatus. Further, the present invention aims at providing a vacuum processing apparatus capable of applying a cleaning method that removes particles attached to the sample stage easily and with high probability, and a vacuum processing method using the same.

2. Description of the related art

In the field of manufacturing semiconductor devices, there are strong demands to improve the yield factor. One of the major causes that deteriorate yield are the particles attached to the sample to be processed, causing pattern defects and creating defective products. There are a number of routes through which particles are attached to the sample to be processed, and especially in apparatuses that process semiconductor devices using plasma, such as sputtering apparatuses, CVD apparatuses or plasma etching apparatuses, the particles existing in the processing chamber become problematic, which are generated from the reaction products of the processing gas and the sample material being processed via plasma treatment, deposited in the processing chamber, and then removed from the chamber wall via pressure variation, contact shock and so on. Furthermore, it is necessary to reduce the amount of particles on the surface of the sample stage, since it is the area that becomes closest to the sample being processed within the processing chamber, and the particles thereon have a high possibility of being attached to the sample to be processed. In recent years, electrostatic chuck force is used widely to support the sample to the stage, but the particles on the surface of the sample stage undesirably widen the distance between the sample and the electrostatic chuck surface, causing attenuation of the electrostatic chuck force.

The sample stage controls the temperature of the sample using both thermal conductance of gas by introducing thermal conductance gas such as helium to the electrostatic chuck surface between the sample and the sample stage and the contact thermal conductance between the sample and the electrostatic chuck surface. However, when the electrostatic chuck force varies by the particles attached to the surface of the sample stage, the thermal conductance efficiency by the contact thermal conductance is deteriorated, and the temperature distribution within the sample becomes uneven. Moreover, when particles are attached to the outer circumference of the sample on the electrostatic chuck surface, thermal conductance gas leak is increased, and the thermal conductance gas pressure between the sample and the electrostatic chuck surface is changed, by which the thermal conductance effect by gas becomes uneven. Thereby, the temperature of the sample stage cannot be controlled to a uniform temperature throughout the whole body of the sample to be processed, and the temperature of the sample becomes unstable and uneven, making it impossible to perform high accuracy processing. Thereby, the reduction of particles on the electrostatic chuck surface of the sample stage is a serious problem to be solved not only from the viewpoint of reducing particles attached to the sample surface but also from the viewpoint of stabilizing and uniformizing the sample temperature.

Generally, particles on the sample stage have been removed by temporarily releasing the interior of the vacuum reactor to atmosphere, wiping off the particles on the sample stage surface directly or replacing the sample stage, and evacuating the interior of the reactor. However, the greatest drawback of such conventional process was that it required a long time before the processing apparatus was restored. Japanese patent application laid-open publication No. 10-321488 (patent document 1) discloses a method for easily removing particles without braking vacuum by placing a dummy sample having an adhesive sheet attached to the rear surface thereof on a sample stage via the same operation as transferring a normal sample, performing electrostatic chuck so as to have particles attach to the adhesive sheet on the rear surface of the dummy sample, and removing the same.

Japanese patent application laid-open publication No. 2005-317782 (patent document 2) discloses a method for removing particles on the rear surface of the sample to be processed by applying high voltage to the sample stage to detach the particles from the stage while introducing dust removal gas so as to remove the particles via shock waves. Furthermore, patent document 2 discloses another method for removing particles on the sample stage by holding the sample up from the sample stage via push-up pins, introducing gas through thermal conductance gas holes, applying high voltage to generate plasma in the space between the sample stage and the sample, and thereby cleaning the sample stage. According to this method, if the particles attached to the sample stage are organic reaction products, for example, the particles can be removed via oxygen- or fluorine-based plasma cleaning.

The adhesive sheet for removing particles is formed of organic polymer, so it may not have sufficient heat resistance. Therefore, if the temperature of the sample stage is high, the adherence property of the of the dummy sample is increased, so that the adhesive agent may remain on the surface of the sample stage during electrostatic chuck, or sample displacement may occur when carrying out the dummy sample. Further, in order to regenerate the used dummy sample, it is necessary to remove the adhesive sheet, clean the sample, and adhere a new adhesive sheet thereto, requiring additional steps to be introduced.

Moreover, according to the method for applying high voltage to the sample stage to detach the particles from the sample stage while introducing dust removal gas to thereby remove particles via shock waves, a large amount of gas is required to remove the particles, and the pressure during gas introduction may cause the substrate to be blown away by the gas.

Further according to the method for generating plasma in the space between the sample stage and the sample to thereby remove particles on the sample stage, in order to remove alumina-based particles, it is necessary to apply a high bias in order to remove the particles via plasma cleaning. Therefore, it is difficult to remove the particles without damaging the sample stage surface. Even if plasma cleaning is performed without applying high bias, the electrostatic chuck surface may be exposed to plasma and damaged thereby. Further, since the sample is simply supported via push-up pins, it is not desirable to raise the gas pressure and increase the gas flow rate, considering the displacement of the sample that may occur. Therefore, the particle removing effect via the hydrodynamic force of gas flow is limited.

SUMMARY OF THE INVENTION

The object of the present invention is to provide a vacuum processing apparatus having a particle removing function to remove particles from the surface of the sample stage in order to improve the yield of the sample being processed, and a vacuum processing method using the same.

Another object of the present invention is to provide a vacuum processing apparatus equipped with a function to efficiently and easily remove particles on the surface of the sample stage and to cut down the recovery time of the processing apparatus, and a vacuum processing method using the same.

The present invention solves the above-mentioned problem by providing a vacuum processing apparatus comprising a processing chamber disposed inside a vacuum reactor and having plasma formed therein; a sample stage arranged at a lower portion within the processing chamber and having a sample to be processed placed on an upper plane thereof; a gas introduction mechanism positioned at an upper portion of the processing chamber and having introduction holes for introducing processing gas into the processing chamber; a means for carrying a dummy sample onto the sample stage within the vacuum reactor and placing the dummy sample on the sample stage; an electrostatic chuck means for fixing the sample to be processed on the sample stage; a means for introducing a thermal conductance gas between the sample stage and the sample to be processed for controlling the temperature of the sample to be processed; a means for introducing a dust removal gas between the sample stage and the dummy sample; and a means for switching between introducing thermal conductance gas and introducing dust removal gas.

The present invention solves the problem by providing the above-mentioned vacuum processing apparatus, wherein the electrostatic chuck means of the sample stage is a monopole system that operates when plasma is generated, or a dipole system that operates even when plasma is not generated.

The present invention solves the problem by providing the above-mentioned vacuum processing apparatus, further comprising a means for varying a DC voltage applied to the electrostatic chuck means.

The present invention solves the problem by providing the above-mentioned vacuum processing apparatus, wherein the dummy sample placed on the sample stage has a protruded portion on the rear surface thereof, wherein when the protruded portion of the dummy sample is retained on the sample stage via electrostatic chuck, the protruded portion defines a flow path of dust removal gas introduced from the sample stage.

The present invention solves the problem by providing the above-mentioned vacuum processing apparatus, wherein the dummy sample has a pattern formed on a surface facing the sample stage reversed with respect to the pattern of the grooves formed to fill the thermal conductance gas between the sample to be processed and the sample stage, so that when dust removal gas is introduced between the dummy sample and the sample stage, the whole clearance between the dummy sample and the sample stage has the same conductance, and that the dummy sample is formed of a semiconductor material such as silicon.

The present invention solves the problem by providing the above-mentioned vacuum processing apparatus, wherein a supply port for supplying dust removal gas of the means for introducing the dust removal gas through the sample stage is also a supply port for supplying thermal conductance gas of the means for introducing the thermal conductance gas, and the dust removal gas is either helium, argon or nitrogen.

The present invention solves the problem by providing a vacuum processing method using a vacuum processing apparatus comprising a processing chamber disposed inside a vacuum reactor and having plasma formed therein; a sample stage arranged at a lower portion within the processing chamber and having a sample to be processed placed on an upper plane thereof; and a gas introduction mechanism positioned at an upper portion of the processing chamber and having introduction holes for introducing processing gas into the processing chamber; a means for carrying a dummy sample onto the sample stage within the vacuum reactor and placing the dummy sample on the sample stage; an electrostatic chuck means for fixing the sample to be processed on the sample stage; a means for introducing a thermal conductance gas between the sample stage and the sample to be processed for controlling the temperature of the sample to be processed; a means for introducing a dust removal gas between the sample stage and the dummy sample; and a means for switching between introducing thermal conductance gas and introducing dust removal gas; the vacuum processing method comprising: placing a dummy sample on the sample stage; introducing dust removal gas between the sample stage and the dummy sample; and removing particles attached to the sample stage via the flow of dust removal gas.

The present invention solves the problem by providing the above-mentioned vacuum processing method, further comprising introducing the dust removal gas between the sample and the sample stage after fixing the dummy sample to the sample stage via electrostatic chuck.

The present invention solves the problem by providing the above-mentioned vacuum processing method, wherein the electrostatic chuck means of the sample stage is a monopole system in which after placing the dummy sample on the sample stage, plasma generating gas is introduced from the gas introducing mechanism to generate plasma, the dummy sample is electrostatically chucked via the electrostatic chuck means, and thereafter, dust removal gas is introduced between the dummy sample and the sample stage.

The present invention solves the problem by providing the above-mentioned vacuum processing method, wherein the electrostatic chuck means of the sample stage is a dipole system in which after placing the dummy sample on the sample stage, the dummy sample is electrostatically chucked via the electrostatic chuck mechanism, and thereafter, dust removal gas is introduced between the dummy sample and the sample stage.

The present invention solves the problem by providing the above-mentioned vacuum processing method, further comprising introducing dust removal gas between the dummy sample and the sample stage, and varying the DC voltage applied to the electrostatic chuck means.

The present invention solves the problem by providing the above-mentioned vacuum processing method, wherein a surface facing the sample stage of the dummy sample has a protruded portion on the rear surface thereof, wherein when the protruded portion of the dummy sample is retained on the sample stage via electrostatic chuck, the protruded portion defines a flow path of dust removal gas introduced from the sample stage.

The present invention solves the problem by providing the above-mentioned vacuum processing method, wherein the dust removal gas introduced from the sample stage is either helium, argon or nitrogen.

Further, the present invention solves the problem by providing the above-mentioned vacuum processing method, wherein after removing particles attached on the surface of the sample stage by supplying dust removal gas between the dummy sample and the sample stage, the particles attached to the dummy sample are removed from the processing chamber by carrying out the dummy sample.

BRIEF DESCRIPTION OF THE DRAWINGS

FIG. 4 is a flow chart of the restoration operation for removing particles according to embodiments 1 through 7 of the present invention;

DETAILED DESCRIPTION OF THE PREFERRED EMBODIMENTS

Figure 1:
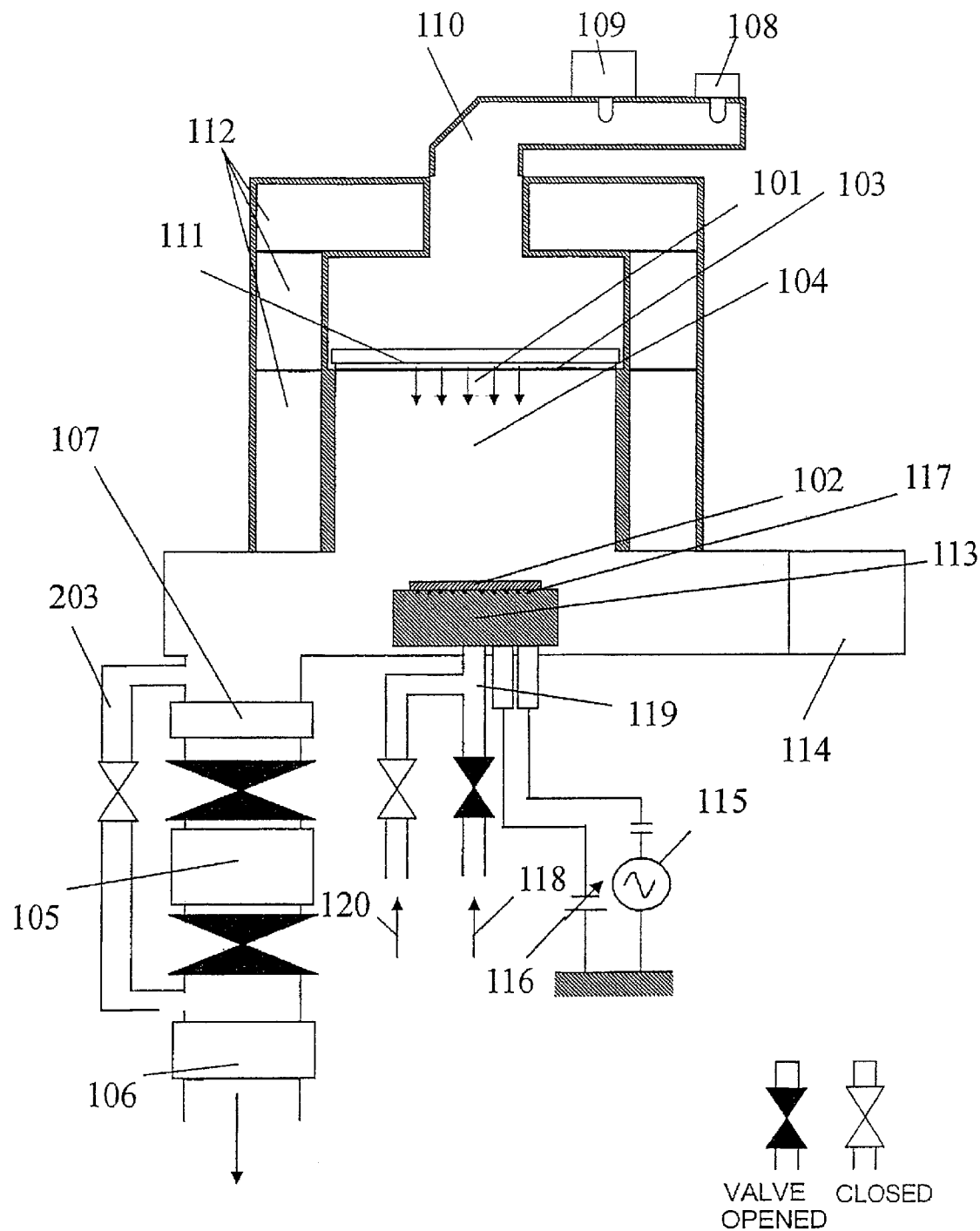
FIG. 1 is a view showing the structure of a processing chamber of a processing apparatus according to embodiments 1 through 7 of the present invention.

Now, the preferred embodiments of the present invention will be described with reference to the drawings. The outline of the structure of the vacuum processing apparatus according to the present embodiment will be described with reference to FIG. 1. The vacuum processing apparatus comprises a shower plate 103, a processing chamber 104, a turbo-molecular pump 105, a dry pump 106, a pressure controller 107, a microwave oscillator 108, a matching circuit 109, a wave guide 110, a microwave introducing window 111, a solenoid coil 112 for generating magnetic field, a sample stage 113, a pressure exchanging chamber 114, a high frequency power supply 115, a DC power supply 116, a gas supply port 119, and grooves 117. Valves are provided respectively between the turbo-molecular pump 105, the dry pump 106 and the pressure controller 107. Valves are also provided respectively in the supply pipe of thermal conductance gas 118 and in the supply pipe of dust removal gas 120. Moreover, a by pass pipe 203 having a valve provided within the path is provided between the processing chamber 104 and the dry pump 106 in parallel with the turbo-molecular pump 105 and the pressure controller 107.

Either the thermal conductance gas 118 or the dust removal gas 120 is selected and supplied to the sample stage by selectively opening the valve of either the thermal conductance gas 118 or the dust removal gas 120 and closing the other valve. The gas supply port 119 is provided at the substantial center portion of the sample stage 113, which is used in common for both the thermal conductance gas 118 and the dust removal gas 120.

In the present vacuum processing apparatus, the processing gas 101 is supplied to the processing chamber 104 through a shower plate 103 having multiple introduction holes with the aim to supply the processing gas 101 uniformly with respect to the sample 102 to be processed. The processing chamber 104 is evacuated via an evacuation system composed of a turbo-molecular pump 105 and a dry pump 106 positioned downstream therefrom. A pressure controller 107 is provided on the upstream side of the turbo-molecular pump 105, by which the inner pressure of the processing chamber 104 is controlled to target pressure. Thereafter, microwaves with a frequency of 2.45 GHz oscillated via the microwave oscillator 108 is transferred via the matching network 109, the waveguide 110 and the microwave introduction window 111 into the processing chamber 104, by which the processing gas 101 is turned into plasma. Solenoid coils 112 for generating magnetic fields for realizing highly efficient discharge are disposed around the processing chamber 104, which are used to create a magnetic field of 0.0875 tesla, and high density plasma is generated via electron cyclotron resonance.

A sample stage 113 is disposed in the processing chamber 104, and a sample to be processed 102 which is a semiconductor material formed of silicon or the like is carried onto the sample stage 113 from the pressure exchanging chamber 114 to subject the same to plasma processing. A valve for realizing a vacuum seal is provided between the processing chamber 104 and the pressure exchanging chamber 114, but it is not shown in FIG. 1. Further, a vacuum reactor and a transfer system for carrying the sample 102 to be processed from the pressure exchanging chamber 114 to atmosphere, but these components are not shown in FIG. 1. A high frequency power supply 115 is connected to the sample stage 113 for placing the sample 102 to be processed, by which a high frequency bias of 400 kHz to 13.56 MHz can be applied. Further, a DC power supply 116 is connected to the sample stage 113, and by applying DC voltage, the sample 102 is electrostatically chucked and fixed to the sample stage. The DC power supply 116 for supplying power to the sample stage 113 has a mechanism for changing the applied voltage arbitrarily.

Moreover, in order to process the sample 102 with superior in-plane uniformity, thermal conductance gas 118 such as helium is supplied between the electrostatically chucked sample 102 and the surface of the sample stage 113, so as to enhance the thermal conductance efficiency between the sample 102 and the sample stage 113 in order to stably control the temperature of the sample 102 either uniformly or to have a given radial distribution. The thermal conductance gas 118 is supplied through the gas supply port 119 at the center of the sample stage 113. Grooves 117 are provided on the surface of the sample stage 113, enabling prompt supply and discharge of thermal conductance gas 118. In order for the electrostatic chuck to function, a closed circuit must be formed from the DC power supply 116 to the sample stage 113 and the sample 102, so that high voltage is applied between the electrostatic chuck film formed on the surface of the sample stage 113 and the sample 102. The circuit arrangement can be a monopole type arrangement in which the electrostatic chuck operates when plasma is generated, or a dipole type arrangement in which the chuck operates even when plasma is not generated.

First Embodiment

According to the present embodiment, the apparatus is equipped with a mechanism for selectively introducing either the thermal conductance gas 118 from the gas supply port 119 provided at the center of the sample stage 113 or a dust removal gas 120 such as helium, argon or nitrogen by operating valves provided to the respective gas supply paths.

Figure 2:
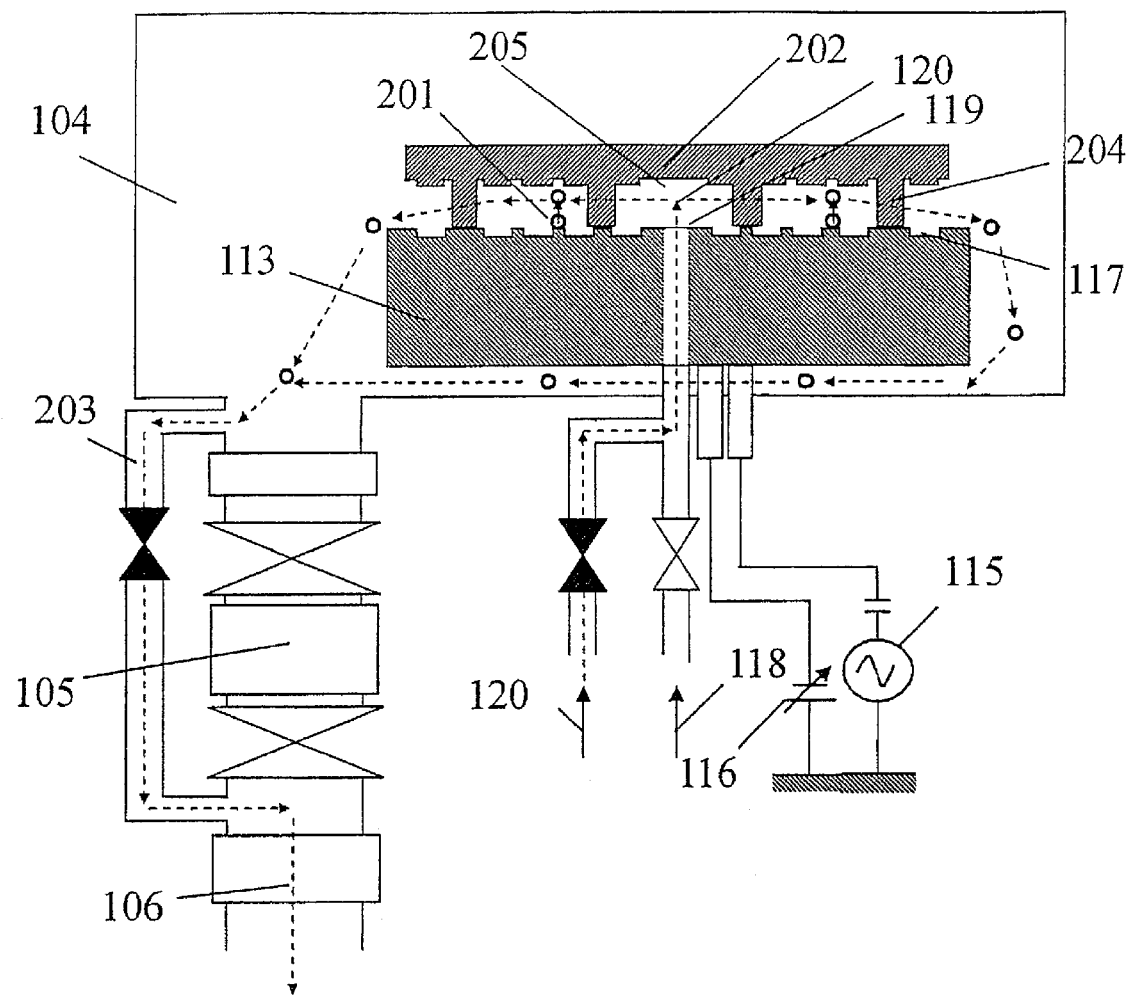
FIG. 2 is a schematic view showing a dummy wafer placed on a sample stage for removing particles according to embodiments 1 through 7 of the present invention, wherein the dummy sample is shown in a cross-section taken at X-X' of FIG. 3.
Figure 3:
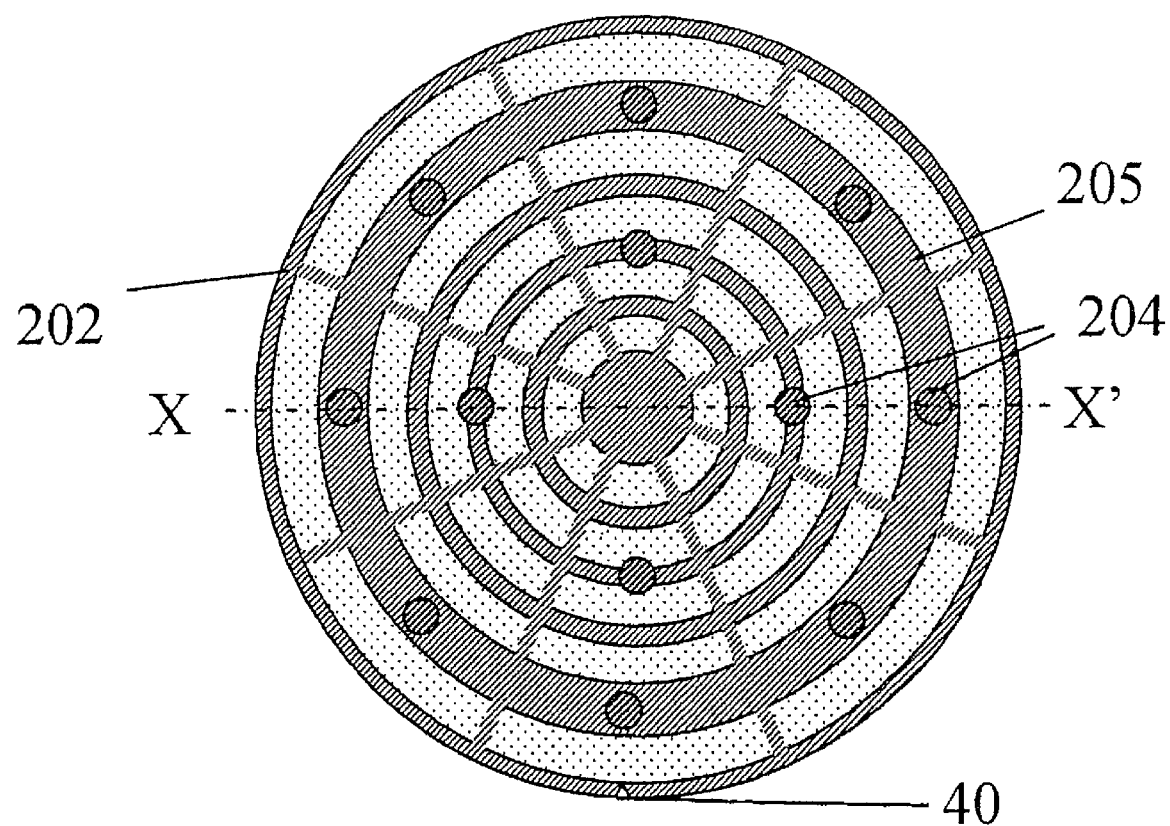
FIG. 3 is a rear view of the dummy sample used in embodiments 1 through 7 of the present invention.

FIGS. 2 and 3 are referred to in describing the method for removing particles on the sample stage 113 according to the first embodiment of the present invention. FIG. 2 is a view illustrating the schematics of transferring and placing a dummy sample 202 used for removing particles on the sample stage 113. FIG. 3 is an explanatory view showing the rear surface shape of the dummy sample. The dummy sample 202 of FIG. 2 corresponds to cross-section X-X' of FIG. 3. After transferring the dummy sample 202, a large flow of dust removal gas 120 such as helium, argon or nitrogen is introduced through the gas supply port 119 provided at the center of the sample stage 113, and particles 201 attached to the surface of the sample stage 113 is removed by the hydrodynamic force of the dust removal gas 120 flown toward the outer circumference of the sample stage 113. At this time, the large flow of gas from the processing chamber 104 exceeds the evacuation performance of the turbo pump 105, so the gas is evacuated via a pipe 203 bypassing the turbo pump 105 and through a dry pump 106.

The dummy sample 202 is formed of silicon or other semiconductor material, and has as much weight as possible within the transferrable range of weight so that sample displacement does not occur by the gas pressure of the dust removal gas 120. Further, since grooves 117 for supplying the thermal conductance gas 118 in a dispersed manner are formed on the surface of the sample stage 113, if a flat sample is placed on the sample stage, the clearance between the sample stage 113 and the rear surface of the sample will not be uniform. Therefore, when dust removal gas 120 is supplied, the gas flow may concentrate in the area with a wide clearance, and the dust removal performance may be varied at areas of the sample stage 113. Thus, it is effective to form a pattern on the rear surface of the dummy sample 202 so that the clearance between the surface of the sample stage 113 and the rear surface of the dummy sample 202 is uniform within the range of 0.5 to 1.0 mm. If uneven dust removal performance of the sample stage 113 occurs when a dummy sample 202 having a flat rear surface is used, it is effective to use a dummy sample 202 having a pattern formed on the rear surface thereof.

That is, as shown in FIG. 3, the rear surface of the dummy sample 202 includes projections 204 formed at portions not interfering with the grooves 117 on the surface of the sample stage 113, and protruded portions having equivalent height as the depth of the grooves 117 formed on the surface opposed to the grooves 117 of the sample stage, with grooves 205 having a depth equal to the depth of the grooves 117 formed at portions opposed to areas other than the grooves 117.

That is, the dummy sample 202 has formed on the surface thereof facing the sample stage 113 a reversed pattern with respect to the pattern of the grooves 117 formed for filling thermal conductance gas for controlling the temperature of the sample to be processed between the sample and the sample stage, so that when dust removal gas 120 is introduced between the dummy sample 202 and the sample stage 113, the whole gas passage between the dummy sample 202 and the sample stage 113 has the same conductance.

As for the pattern formed on the rear surface of the dummy sample 202, it is not a complete reversed version of the pattern of the grooves 117 on the sample stage 113, but portions thereof are projected so as to contact the electrostatic chuck surface of the sample stage 113, so that via the projections 204 coming in contact with the electrostatic chuck surface, the dummy sample 202 is electrostatically chucked to the sample stage 120. Even if there is no need to perform electrostatic chuck, projections 204 are naturally necessary to maintain a fixed clearance between the sample stage 120 and the rear surface of the dummy sample 202.

The dummy sample can be the same type of sample as the sample to be processed.

When removing particles 201 attached to the surface of the sample stage 120 via the hydrodynamic force of the dust removal gas 120, the hydrodynamic force F acting on the attached particles 201 can be expressed as $F=16 \, \mu UD$, wherein the flow rate of dust removal gas 120 is U, the coefficient of viscosity is $\mu$, and the diameter of the attached particles 201 (assuming that they are spherical) is D. Therefore, in order to remove the attached particles 201, it is effective to set the flow rate of the dust removal gas 120 to high speed. That is, by setting the clearance between the sample and the sample stage to 0.5 to 1.0 mm, the flow rate of dust removal gas 120 with respect to the supply quantity can be increased.

Second Embodiment

Now, the second embodiment of the present invention will be described. The second embodiment relates to a dust removal method described in the first embodiment applied in combination with a method for separating particles 201 from the surface of the sample stage 113 by applying or varying the voltage applied to the sample stage 113 while introducing dust removal gas 120. Thereby, it becomes possible to remove particles 201 efficiently. The present embodiment provides an effective method for removing particles when it is difficult to provide sufficient hydrodynamic force of dust removal gas 120 compared to the attachment force of the attached particles 201. The dust removal mechanism utilizes the phenomenon where attached particles 201 are suspended via electrostatic force by applying a high voltage of over 1 kV to the sample stage 113. This phenomenon is disclosed, for example, in the following document; T. Moriya, et al., IEEE Transactions on Semiconductor Manufacturing, Vol. 18, p. 477 (2005). If attached particles 201 are suspended, the hydrodynamic force of the dust removal gas 120 enables to move particles 201 outside the sample stage 113. Therefore, by using in combination the application of voltage to the sample stage 113 and the introduction of dust removal gas 120, it becomes possible to enhance the dust removal efficiency.

Third Embodiment

Now, the third embodiment of the present invention will be described. The third embodiment relates to a dust removal method described in the first embodiment, wherein particles 201 can be removed even by introducing dust removal gas 120 while fixing the dummy sample 202 used for removing particles 201 via electrostatic chuck force to the sample stage 113. The dummy sample 202 is fixed to the sample stage 113 via electrostatic chuck force, so that even when dust removal gas 120 is introduced, the gas pressure will not cause displacement of the dummy sample 202. Therefore, since it is not necessary to increase the weight of the dummy sample 202 more than necessary, the transferring of samples is facilitated. For example, even if the weight of the dummy sample is equivalent to that of the sample to be processed, the particles 201 can be removed without causing sample displacement.

Fourth Embodiment

The fourth embodiment of the present invention will now be described. The present embodiment relates to a dust removal method described in the third embodiment, wherein by applying an electrostatic chuck voltage to the sample stage 113 even when no dust removal gas is introduced, particles can be separated from the surface of the sample stage 113 and attached to the dummy sample 202 opposed to the sample stage 113, so that particles 201 can be removed by carrying the particles 201 out of the processing chamber 104 together with the dummy sample.

Fifth Embodiment

The fifth embodiment of the present embodiment will now be described. The present embodiment relates to a dust removal method described in the third embodiment, wherein by varying the voltage within a voltage range, such as from 300 V to 3000 V, sufficient for electrostatically chucking the dummy sample 202 onto the sample stage 113, particles 201 are separated from the surface of the sample stage 113 while introducing dust removal gas 120 to thereby efficiently remove the particles 201.

Sixth embodiment

Further, the sixth embodiment of the present embodiment will now be described. The present embodiment relates to a dust removal method described in the fifth embodiment, wherein the electrostatic chuck voltage is turned on and off repeatedly for a number of times without introducing dust removal gas. At this time, particles 201 are separated from and attached to the sample stage repeatedly, so that they can easily be removed via the hydrodynamic force of the dust removal gas 120 as described. Thereafter, by turning the electrostatic chuck voltage on and introducing dust removal gas 120 while fixing the dummy substrate 202, it becomes possible to remove particles 201 efficiently by the flow of dust removal gas 120.

With reference to FIG. 4, we will now describe the normal work flow from the attachment of particles on the sample stage 113 to restoring the vacuum processing apparatus of embodiments 1 through 6 of the present invention, and the work flow according to the present embodiments. According to the prior art particle removal operation, when particles 201 are attached to the sample stage 113, the processing chamber 104 must be released to the atmosphere and cleaned, or otherwise it may become impossible to electrostatically chuck the sample 102 to be processed. This is illustrated in the prior art work flow of FIG. 4. In step A-1, the interior of the processing chamber 104 is initially set to atmospheric pressure so as to enable the vacuum processing chamber 104 to be released to atmosphere. Next, in step A-2, in order to clean the surface of the sample stage 113, parts such as the microwave introducing window 111 and the shower plate 103 air tightly sealing the processing chamber 104 are removed. Thereafter, in step A-3, the parts having been exposed to plasma are replaced with those cleaned in advance, and then, the surface of the sample stage 113 is cleaned. However, once the interior of the vacuum processing chamber 104 is released to the atmosphere, deposits such as reaction products of the processing gas 101 and the sample 102 remaining in the processing chamber 104 absorb the moisture in the atmosphere and are swollen or detached from the chamber, turning into fine particles. Thus, the surface of the sample stage 113 is wiped and cleaned using purified water, organic solvents or the like. In step A-4, the parts removed in step A-2 are reassembled. In step A-5, the processing chamber 104 is vacuumed. In step A-6, after confirming that the interior of the chamber has reached a given vacuum pressure and no leak occurs, running-in discharge is performed so as to stabilize the interior of the processing chamber 104 and to realize a condition for processing samples 102. The above-described method is the prior art method for cleaning the sample stage 113, but since the cleaning requires more than a few hours, the method has a drawback in that throughput is deteriorated.

The preferred embodiments of the present invention adopt a method shown in the right drawing of FIG. 4 illustrating a vacuum retention status. According to the invention, in step B-1, the dummy substrate 202 is carried into the processing chamber 104 and placed on the sample stage 113. In step B-2, simultaneously as applying voltage or varying the voltage applied to the sample stage 113 for removing dust, a dust removal gas 120 selected from a group of inert gases such as He gas, Ar gas and $N_2$ gas is introduced through the gas supply port 119 at the center of the sample stage 113. The surface of the sample stage 113 can be cleaned via this dust removal operation. In step B-3, the dummy sample is carried out of the sample stage, and the apparatus is ready for processing products. According to this method, processing time can be significantly reduced compared to the case of the prior art operation in which the processing chamber must be released to the atmosphere.

Seventh Embodiment

Figure 5:
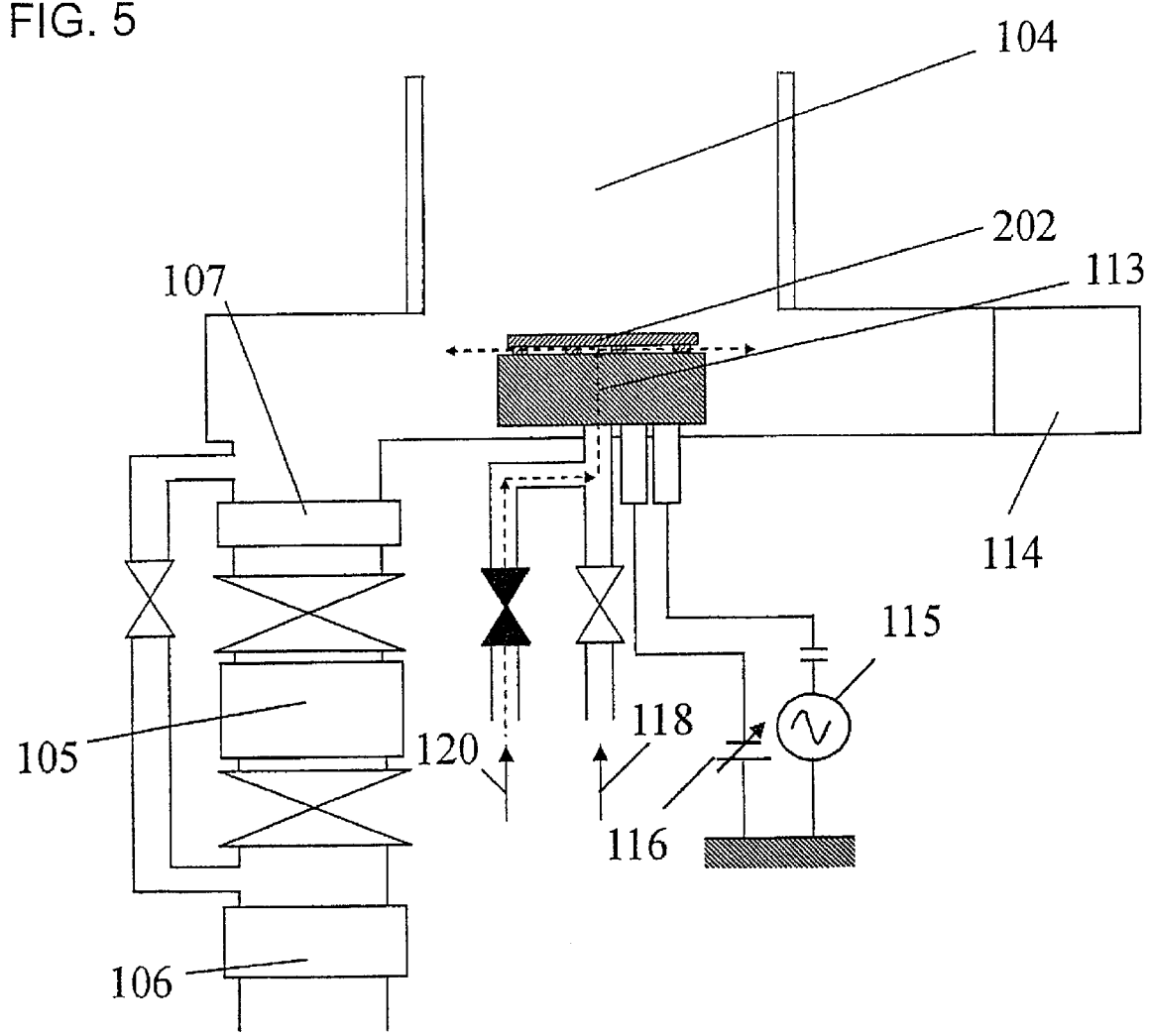
FIG. 5 is a schematic view of the processing apparatus in the atmosphere according to embodiment 8 of the present invention.

The seventh embodiment of the present invention will now be described with reference to FIG. 5. FIG. 5 is a schematic view of the processing chamber 104 of the vacuum processing apparatus illustrated in FIG. 1, wherein the solenoid coil and parts attached thereto such as the microwave oscillator 108, the matching network 109 and the waveguide 110 are lifted up, the interior of the processing chamber 104 is set to atmospheric pressure, and the microwave introducing window 111 and the shower plate 103 disposed above the processing chamber 104 are removed in order to perform periodic maintenance of the vacuum processing apparatus. In this drawing, a dummy sample 202 or another type of dummy sample 202 having increased weight for increased retention force to the sample stage 113 is placed on the sample stage 113 manually. The voltage applied to the surface of the sample stage 113 from the DC power supply 116 is varied so as to separate the particles 201 from the surface of the sample stage 113. The separated particles 201 are evacuated toward the outer circumference of the sample stage 113 together with the dust removal gas 120 such as helium, argon or nitrogen introduced through the gas supply port 119 at the center of the sample stage 113 and released to the atmosphere. In other words, since the present operation is performed in the atmosphere and the dummy sample 202 can be placed manually by hand, the drawbacks related to the weight of the dummy sample 202 or the displacement thereof can be overcome. Therefore, the dust removal operation can be performed by feeding a large amount of dust removal gas 120. Furthermore, since the sample stage 113 is cleaned in a dry environment, the adsorption of moisture which becomes an obstacle when evacuating the chamber after maintenance can be suppressed, and the maintenance time, or evacuation time, can be cut down. If necessary, when the evacuation after maintenance has completed, it is effective to perform the dust removal method described earlier for removing particles from the sample stage 113.

Figure 6:
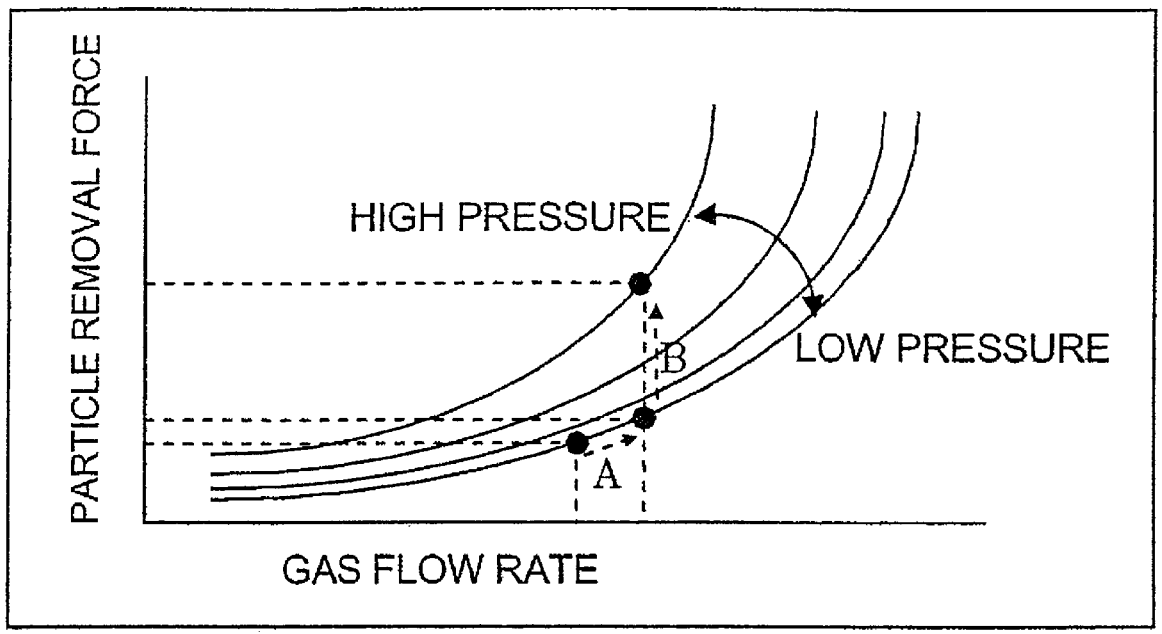
FIG. 6 is a conceptual diagram showing the relationship between particle removal force and gas flow rate of the introduced dust removal gas.

FIG. 6 is a drawing showing the qualitative relationship between the gas flow rate by the introduction of dust removal gas 120 such as helium, argon or nitrogen and the removal force of particles 201. One can recognize from FIG. 6 a status A showing that the force of removing particles 201 attached to the surface of the sample stage 113 is increased along with the increase of flow rate of gas being supplied thereto, and a status B showing that the effect of removing particles is enhanced as the pressure of gas is increased. It can be recognized from the illustrated relationship that the force of removing particles 201 is stronger when a high gas flow rate having high pressure is used.

Conditions such as the gas pressure and gas flow rate, the size of the particles and the force in which the particles are attached to the sample stage have a great influence in the attempt to blow off the particles attached to the sample stage by introducing gas, so that it is necessary to understand these conditions and the particle removal efficiency. The following describes the relational expression thereof using a simple model.

The attachment of particles in the plasma processing apparatus is considered to be related to van der Waals' force (atomic force), electrostatic force and the like. Here, the attachment force is estimated by assuming that the force only regards the van der Waals' force existing in all particles. If the material of particles and sample stage is alumina and the particles are spherical having a diameter D, the van der Waals' force Fw is expressed by the following expression.

[Expression 1]

$$F_W = -\frac{HD}{12h^2} \quad (1)$$

Here, H represents Hammaker coefficient wherein $H=15.5\times10^{-20}$ (J), h is the clearance between the particles and sample stage, wherein $h\approx0.4$ (nm)=$4\times10^{-10}$ (m) if particles are attached. The size of target particles according to the present invention is approximately 1 to 5 μm, so it is supposed that D=5 μm=$5\times10^{-6}$ (m). These numeric values are assigned to expression (1) to obtain a van der Waals' force Fw=$4.0\times10^{-7}$ (N).

Next, the conditions for blowing off the attached particles via the hydrodynamic force of gas flow are considered by comparing a moment $M_G$ operating to move the particle via hydrodynamic force and a moment $M_F$ of the attachment force preventing the particle from being blown off by moment $M_G$, and assuming that the particle is blown off when $MG \geq MF$. The reference of this model is the following document: K. Bakhtari, et al., Journal of The Electrochemical Society, Vol. 153, C603 (2006).

The particles have various shapes, and the conditions of attachment thereof are not uniform, so a condition of attachment of a spherical particle is arbitrarily assumed, and a moment $M_G$ operating to move the particle and a moment $M_F$ via attachment force are computed. The results are shown in the following expressions.

[Expression 2]

$$F_D = \frac{32\eta DU}{b} \quad (2)$$

$$K = \frac{M_G}{M_F} = \frac{F_D(1.74D/2)}{F_W(D/4)} = \frac{668\eta h^2 DU}{bH} \quad (3)$$

Here, $F_D$ represents the hydrodynamic force operating around the particle, U represents the flow rate, b represents the clearance between the dummy sample and the sample stage surface, and η represents the coefficient of viscosity (the coefficient of viscosity of He is $16.9\times10^{-6}$ Pa·s). In expression (2), a Stokes' zone in which the Reynolds number is two or smaller is assumed. When U equals 1 to 10 m/s and the pressure is approximately 100 Pa, the Reynolds number is approximately 5 to 50, in which the zone transits from Stokes' zone to Allen's zone. However, the upper expression is provided for a general outline.

Then, the actual numerical values are assigned to obtain K, wherein K equals $5.8\times10^{-26}$ U/b. The condition for satisfying $K\geq1$ is $U\geq1.7\times10^{25}$b, and if b is approximately 1 mm, it is actually impossible to satisfy $K\geq1$. Therefore, it is extremely difficult to remove the attached particles simply via the hydrodynamic force of gas flow. Therefore, a method for suspending the attached particles using other means is required to suspend and discharge the suspended particles via the hydrodynamic force of gas flow.

Whether the suspended particles could be transferred via gas flow is computed via trial calculation using a simple model assuming that the particles should be moved via gas flow for at least a radius r (r=0.15 m) of the dummy sample before the suspended particles fall by gravity in clearance b between the dummy sample and the sample stage. When the fall velocity is represented by Vb and the gas flow rate is represented by U, the conditions of particle discharge is represented by the following expression.

[Expression 3]

$$U\left(\frac{b}{r}\right) \geq V_s = \frac{\rho D^2 g}{18\eta}\left\{1 + \frac{\lambda}{D}\left(2.34 + 1.05\exp\left(-0.39\frac{D}{\lambda}\right)\right)\right\} \quad (4)$$

Here, ρ represents the particle density ($3.9\times10^3$ kg/m³ in the case of alumina), g represents the acceleration of gravity, and λ represents the mean free path of gas molecules (λ=19.5 mm in the case of helium of 25° C. and 1 Pa). When assuming that the particles are alumina and the pressure of gas flow is 100 Pa in calculating expression (4), the following expression can be obtained as the condition for discharging particles.

[Expression 4]

$$U \geq \frac{0.063}{b} \quad (5)$$

If the clearance b between the dummy sample and the sample stage is 1 mm, the alumina particles with a diameter of 5 μm can be discharged when $U\geq63$ m/s, if the pressure of gas flow is 100 Pa. If the diameter of the particles or the pressure is changed, the calculation of expression (4) should be performed. For example, if the pressure is set to 500 Pa to remove alumina particles with a diameter of 5 μm, the flow rate when b=1 mm is $U\geq12.8$ m/s, and if the pressure is set to 100 Pa to remove particles with a diameter of 1 μm, the flow rate when b=1 mm is $U\geq12.5$ m/s. It is possible to generate a gas flow with a flow rate of approximately 10 m/s within the pressure range of 100 Pa to 500 Pa, so that it is recognized that suspended particles can be discharged.

On the other hand, it is effective to apply high voltage to the sample stage in order to separate the attached particles from the sample stage. For example, T. Moriya, et al., IEEE Transactions on Semiconductor Manufacturing, Vol. 18, p. 477 (2005) discloses an example where particles are separated from the sample stage by applying high voltage to the sample stage. Therefore, a known effective method for cleaning the sample stage regards applying an electrostatic chuck voltage on the sample stage to attract and support the dummy sample on the sample stage, separating the particles attached to the surface of the sample stage and discharging the same via gas flow.

As described, by using in combination the particle separation phenomenon by applying voltage to the sample stage and the particle discharging effect by feeding dust removal gas, it becomes possible to effectively remove the particles attached to the sample stage via a dry method. Therefore, it becomes possible to overcome the drawbacks such as the change in temperature distribution of the sample caused by particles being attached to the electrostatic chuck surface of the sample stage and deteriorating the flatness thereof, and particles being attached to the front surface of the sample, thereby efficient manufacturing becomes possible by suppressing yield deterioration in manufacturing semiconductor devices. The above description has been illustrated taking a microwave plasma etching apparatus as an example, but the present invention can also be applied to a general vacuum processing apparatus that does not use plasma.

What is claimed is:

1. A vacuum processing apparatus comprising:
    a processing chamber disposed inside a vacuum reactor and having plasma formed therein;
    a sample stage arranged at a lower portion within the processing chamber and having a sample to be processed placed on an upper plane thereof;
    a gas introduction mechanism positioned at an upper portion of the processing chamber and having introduction holes for introducing processing gas into the processing chamber;
    a means for carrying a dummy sample onto the sample stage within the vacuum reactor and placing the dummy sample on the sample stage;
    an electrostatic chuck means for fixing the sample to be processed on the sample stage;
    a means for introducing a thermal conductance gas between the sample stage and the sample to be processed for controlling the temperature of the sample to be processed;
    a means for introducing a dust removal gas between the sample stage and the dummy sample; and
    a means for switching between introducing thermal conductance gas and introducing dust removal gas;
    wherein a supply port for supplying the dust removal gas of the means for introducing the dust removal gas is also a supply port for supplying the thermal conductance gas of the means for introducing the thermal conductance gas.

2. The vacuum processing apparatus according to claim 1, wherein
    the electrostatic chuck means of the sample stage is a dipole system that operates even when plasma is not generated.

3. The vacuum processing apparatus according to claim 1, wherein
    the dummy sample placed on the sample stage has a protruded portion on the rear surface thereof, wherein when the protruded portion of the dummy sample is retained on the sample stage via electrostatic chuck, the protruded portion defines a flow path of dust removal gas introduced from the sample stage.

4. The vacuum processing apparatus according to claim 1, wherein
    the dummy sample has a pattern formed on a surface facing the sample stage that is reversed with respect to the pattern of the grooves formed to fill the thermal conductance gas between the sample to be processed and the sample stage, so that when dust removal gas is introduced between the dummy sample and the sample stage, the whole clearance between the dummy sample and the sample stage has the same conductance.

* * * * *